United States Patent
Wissman et al.

[11] Patent Number: 5,914,608
[45] Date of Patent: Jun. 22, 1999

[54] METHOD AND APPARATUS FOR TRACING COAXIAL CABLES

[75] Inventors: Charles H. Wissman, Oceanside; John N. Rodittis, Vista; Dmitry Berger, San Diego, all of Calif.

[73] Assignee: Tempo Research Corporation, Vista, Calif.

[21] Appl. No.: 08/682,020

[22] Filed: Jul. 16, 1996

[51] Int. Cl.[6] ................................................. G01R 27/26
[52] U.S. Cl. ........................... 324/522; 324/528; 324/529
[58] Field of Search ..................... 324/522, 527, 324/528, 529, 536, 66, 543, 541, 544

[56] References Cited

U.S. PATENT DOCUMENTS

| | | | |
|---|---|---|---|
| 5,185,685 | 2/1993 | Tennies et al. | 324/536 |
| 5,578,931 | 11/1996 | Russell | 324/536 |
| 5,608,328 | 3/1997 | Sanderson | 324/536 |

FOREIGN PATENT DOCUMENTS

| | | | |
|---|---|---|---|
| 0030069 | 2/1984 | Japan | 324/529 |
| 44032783 | 2/1992 | Japan | 324/543 |
| 0924631 | 4/1982 | U.S.S.R. | 324/529 |
| 1180815 | 9/1985 | U.S.S.R. | 324/528 |

*Primary Examiner*—Maura Regan
*Attorney, Agent, or Firm*—Amster, Rothstein & Ebenstein

[57] ABSTRACT

An apparatus and method are provided for use in tracing a cable; the apparatus and method allows a cable to be identified at any point along its length. The apparatus includes a transmitter for applying a unique waveform to a cable of interest, a line terminator for forming a cable loop through which current can flow, and a detector which is capable of detecting both voltage (electric field) and current (magnetic field). The unique waveform induces both a magnetic and an electric field in specifically identifiable patterns.

18 Claims, 4 Drawing Sheets

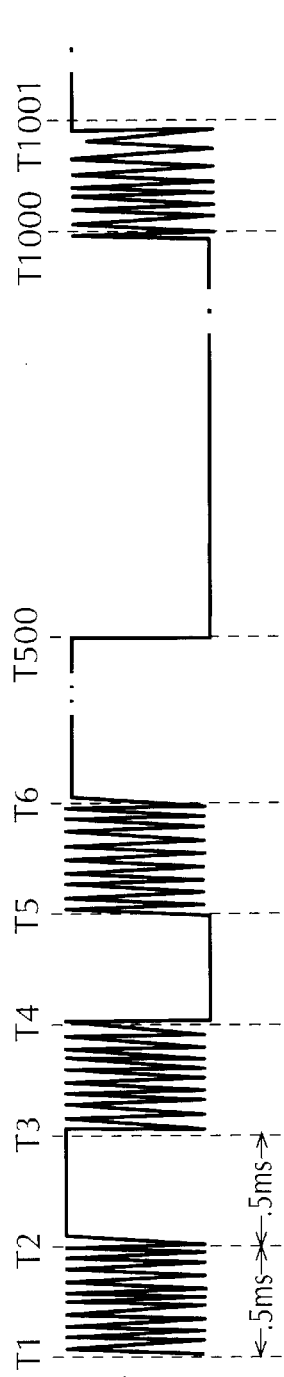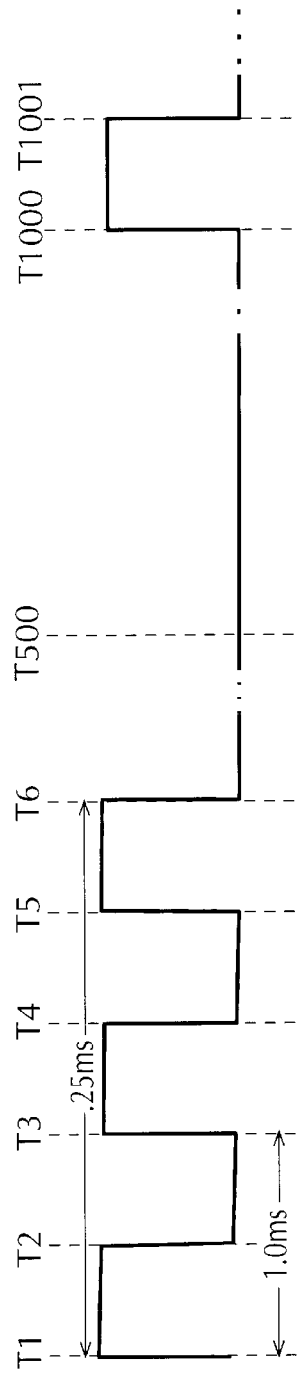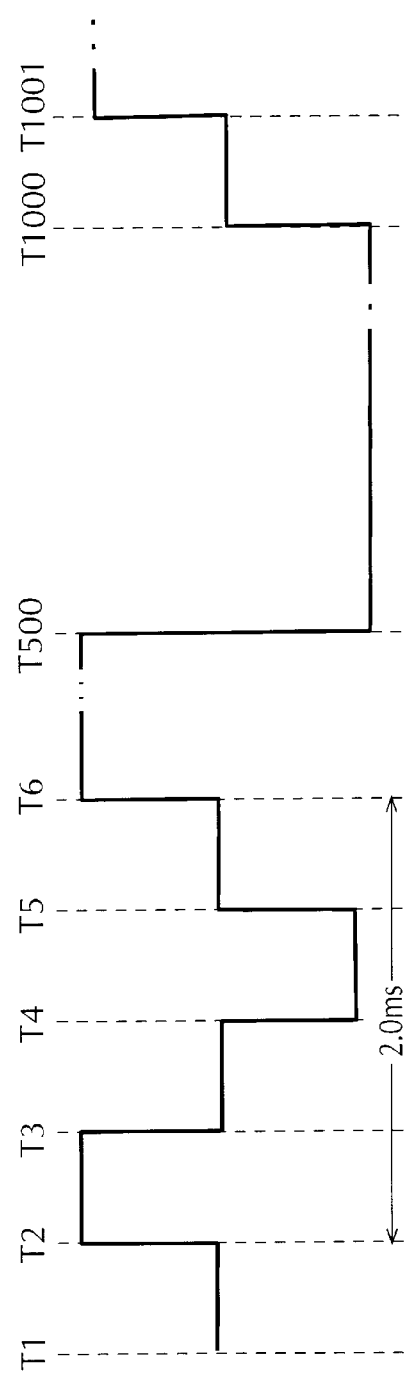

METHOD AND APPARATUS FOR TRACING COAXIAL CABLES

BACKGROUND

The present invention relates to an improved method and apparatus for tracing coaxial cables. Specifically, the present invention is useful for tracing a single coaxial cable within a group of coaxial cables.

A single coaxial cable includes a center conducting wire which is normally insulated from and surrounded by a braided outer conductor. Typical coaxial cable systems involve numerous coaxial cables, the outer conductors of which are often connected to a common ground. In many applications, including modern telecommunications systems, a bundle of as many as 50 coaxial cables may be employed. These cable bundles may extend a half mile in length. Often, for example, to locate and repair a fault, it becomes necessary to monitor the performance of a given cable or, sequentially, a number of cables within a bundle. In such instances, a technician may be required to locate or trace a single cable within a bundle of cables.

Currently, equipment which was developed for tracing twisted pair cables is also used for tracing coaxial cables. In the industry, this equipment is commonly referred to as a "tag toner." Tag toners employ an audio frequency generator to apply an audio frequency voltage signal to the center conductor (relative to the outer conductor) of a coaxial cable. At one end of the coaxial cable, a high impedance amplifier detects the applied voltage signal, amplifies it and outputs the amplified audio signal to a speaker. An operator identifies the cable of interest by listening for an audio tone at the opposite end of the cable to which the audio signal was applied. Only at the ends of the cable are both the center and outer conductors accessible to the amplifier; thus, it is only at the cable's end that the amplifier can detect the voltage signal applied between the center and outer conductors.

Accordingly, voltage tracing methods are only capable of identifying the end of a coaxial cable and are useless for midspan identification. In voltage tracing systems, midspan identification of the specific cable to which the voltage has been applied is impossible because the voltage tends to bleed over to the other lines in the bundle, making the cable of interest indistinguishable from the other cables, except at the cable's end.

Voltage tracing systems can be used to apply a voltage between the outer conductor of a coaxial cable and earth ground, which allows an amplifier to sense voltage midspan along the cable. However, this voltage cannot be used to differentiate one cable from another because in coaxial cable systems the outer conductors of each cable in the bundle are generally all connected to a common ground (shorted together). Thus, any voltage relative to earth ground which is detected on the outer conductor of one cable will appear on the outer conductor of each cable, making it impossible to trace or identify an individual cable.

A current tracing system exists which can be used only for tracing faulted twisted wire pairs. This system is commonly known a "Breakdown Set"—a bulky, expensive system which welds the twisted wire pair together at the fault and then drives a very large current (3 A peak to peak) through the welded pair. An operator then uses a current sensor and amplifier to trace the magnetic field generated by the applied current to the fault location. The Breakdown Set is useful only on faulted cables, and permanently shorts the cable under test at the fault location (i.e., it is a destructive tracing method).

Because the Breakdown Set is intended for welding faulted cables, it is not practical for use with coaxial cables which have much thicker insulation and are therefore much more difficult to weld. Because the Breakdown Set operates in the audio frequency range, a one and a half amp current would have to be applied to the cable under test in order to generate a detectable signal. Even a one and a half amp current will provide only weak signal. Further, application of a one and a half amp current would damage any other equipment (such as VCR's etc.) which may be connected to the cable under test.

Thus, there is a need in the art for a method and apparatus that will allow an operator to identify a single coaxial cable at any point along its length.

Accordingly, it is an object of the present invention to provide a method and apparatus that will allow a single coaxial cable within a cable bundle to be identified at any point along the cable's length.

It is a further object of the present invention to provide a unique method and apparatus for combining both current and voltage tracing, thereby obtaining the benefits of both systems.

A further object of the invention is to provide an apparatus and method that advantageously employs the imbalance ordinarily occurring in coaxial cable systems.

Yet another object of the invention is to provide a compact and inexpensive apparatus for tracing and identifying a specific coaxial cable within a cable bundle, at any point along the cable's length.

Other objects, features and advantages of the present invention will become more fully apparent from the following detailed description of the preferred embodiment, the appended claims and the accompanying drawings, in which:

FIG. 4 is a timing diagram describing the preferred operation of the apparatus of FIG. 3.

DETAILED DESCRIPTION OF THE PREFERRED EMBODIMENTS

The present invention allows an operator to identify a single cable within a multi-cable bundle at any point along the cable's length. The preferred embodiment features the ability to identify the end of a cable of interest via a voltage signal (voltage mode), and the ability to trace or identify the cable midspan via a current signal (current mode). As well, the preferred embodiment features a unique waveform which may be detected by either a voltage sensor or a current sensor and which (when used to drive a speaker) generates a distinct audio tone, depending upon which mode is being used.

Figure 1:
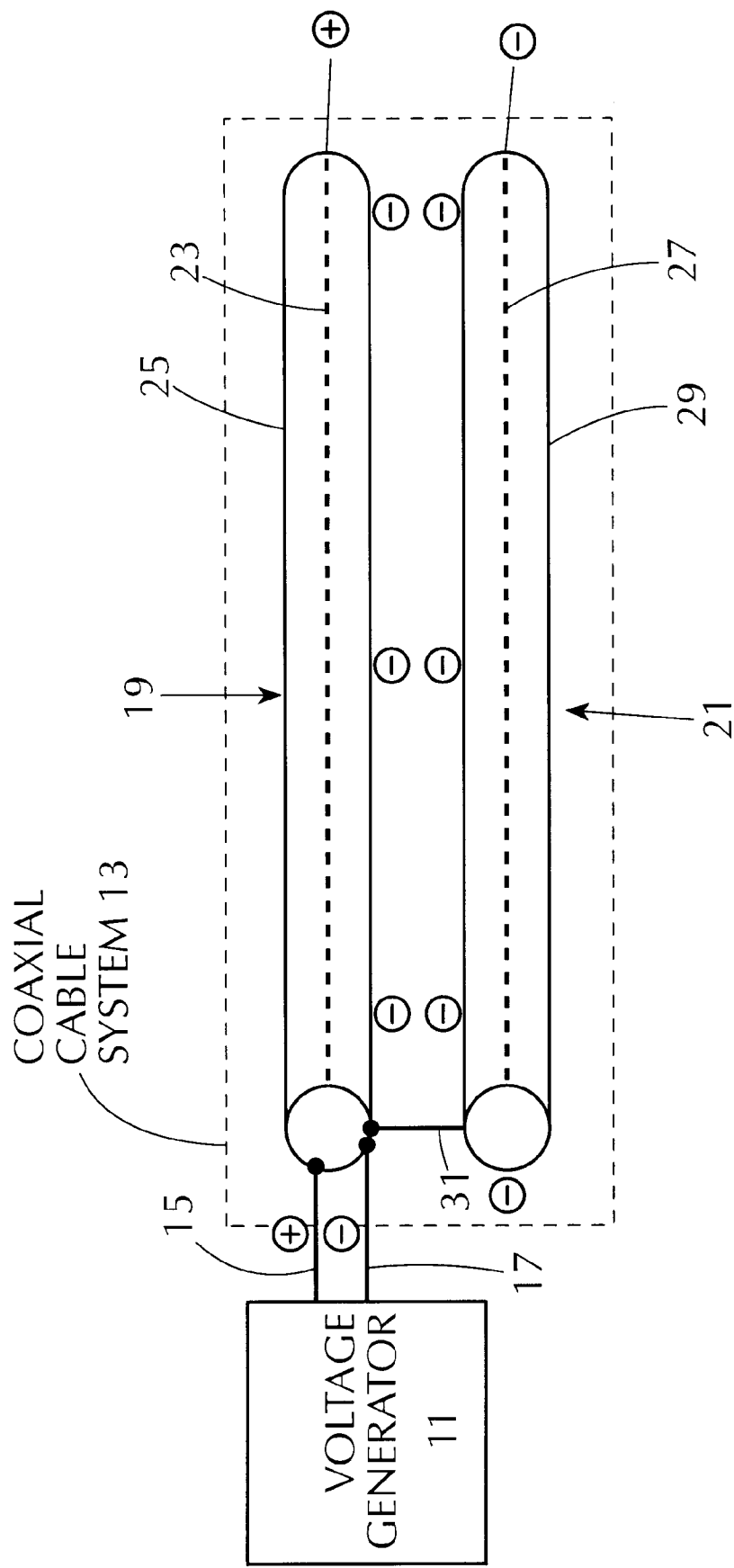
FIG. 1 is a schematic diagram depicting prior art voltage tracing as applied to a coaxial cable system.

FIG. 1 is a schematic diagram depicting voltage tracing as applied to a coaxial cable system in which a voltage generator 11 is shown connected to a coaxial cable system 13. Voltage generator 11 has a first output lead 15 and a second output lead 17, and coaxial cable system 13 is shown having a first cable 19 and a second cable 21. First cable 19 has a center conductor 23 and an outer conductor 25 which surrounds center conductor 23. Second cable 21 has a center conductor 27 and an outer conductor 29 which surrounds center conductor 27. Outer conductors 25 and 29 are connected as represented by a line 31.

In operation, first output lead 15 and second output lead 17 are selectively connected to center conductor 23 and outer conductor 25, respectively. Voltage generator 11 outputs a voltage between first output lead 15 and second output lead 17, with first output lead 15 being positively charged with respect to second output lead 17. Thus, a positive charge is applied to center conductor 23 and a negative charge (relative to center conductor 23) is applied to outer conductor 25. However, even in the absence of line 31, some negative charge would build up on outer conductor 29.

Accordingly, as only outer conductors 25 and 29 are accessible at any point along the length of first cable 19 and second cable 21 (other than the ends), and as both outer conductors 25 and 29 exhibit a negative charge, it is impossible to identify the cable of interest (the cable with the positively charged center conductor) except at the end of the cables where the center conductors are accessible.

Figure 2:
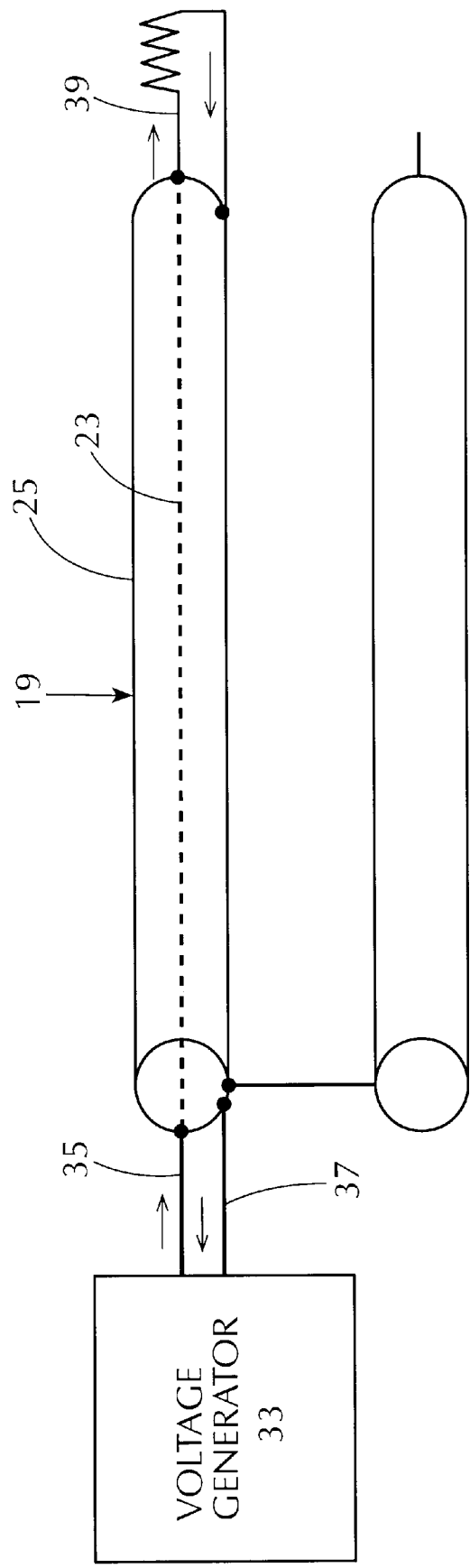
FIG. 2 is a schematic diagram depicting a preferred embodiment for current tracing as applied to a coaxial cable system.

FIG. 2 is a schematic diagram depicting current tracing as applied to a coaxial cable system in which a voltage generator 33 is shown connected to coaxial cable system 13. Voltage generator 33 has a first output lead 35 and a second output lead 37. The end of the cable of interest (in this example, first cable 19) is supplied with a line terminator 39. In the preferred embodiment, line terminator 39 is a conducting wire which connects (i.e., shorts) center conductor 23 to outer conductor 25. However, the invention will work with other terminators, including the 75 ohm resistor terminator common in the industry.

In operation, first output lead 35 and second output lead 37 are selectively connected to center conductor 23 and outer conductor 25, respectively. Voltage generator 33 outputs a voltage between output lead 35 and output lead 37, thereby inducing a current to flow from output lead 35 to center conductor 23. The current travels along center conductor 23 through line terminator 39 and returns through outer conductor 25 to output lead 37.

Unlike the voltage based system, the current in the current based system remains isolated to the cable of interest. The current based system of the present invention allows a sensor to detect the current (i.e., the magnetic field generated by the current) present on first cable 19 at any point along the length of first cable 19. Thus, the current based system can trace a single coaxial cable midspan among other cables. If first cable 19 were ideal, there would be no magnetic field produced outside cable 19 because the current on center conductor 23 would be equal and opposite to the current on outer conductor 25, and the magnetic field produced by outer conductor 25 would cancel the magnetic field produced by center conductor 23. However, asymmetries and gaps in outer conductor 25 cause an imbalance between the two opposite magnetic fields. As a result of this imbalance, a net magnetic field which can be easily detected is produced outside first cable 19.

In the preferred embodiment, voltage generator 33 generates a current in the range from 30 kHz to 100 kHz (most preferably, 84 kHz) in order to take advantage of the cable imbalance in most commonly used coaxial cables.

An 84 kHz voltage is preferred because with an 84 kHz voltage, an inexpensive microprocessor may be employed within voltage generator 33. A voltage signal in the frequency range of 30 kHz to 100 kHz is preferred as higher frequency signals may couple to adjacent cables and lower frequency signals would require large currents to flow through the cable under test, and would require the use of a very large coil within current sensor 63.

Figure 3:
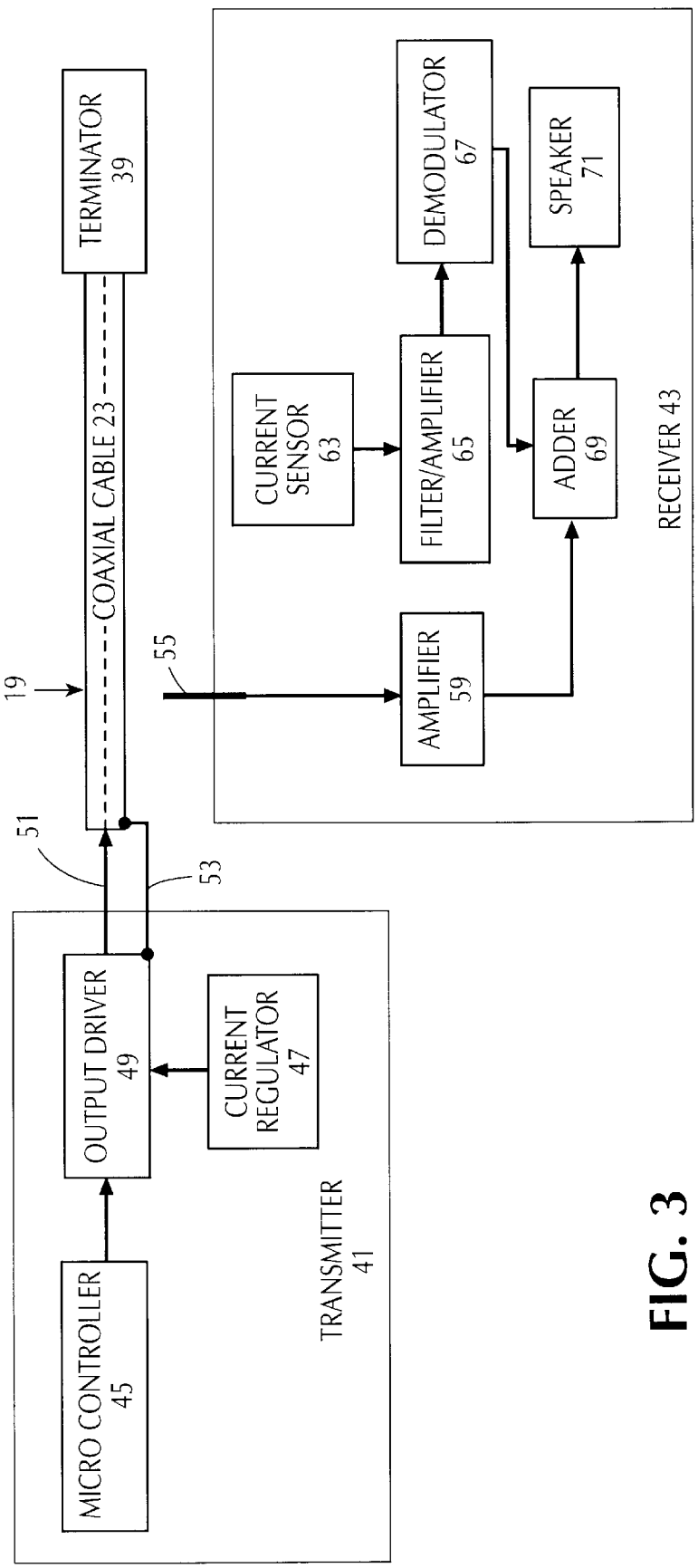
FIG. 3 is a block diagram depicting the apparatus of the present invention in a preferred embodiment.

FIG. 3 is a block diagram of a preferred embodiment of the present invention, depicting a transmitter 41, a receiver 43 and line terminator 39. The apparatus of FIG. 3 allows for both current and voltage based cable identification. The current based tracing system of the present invention requires an operator to locate both ends of the cable of interest in order to apply line terminator 39 to one end of the cable. In order to allow midspan cable identification and to conveniently locate the end of a cable of interest, the preferred embodiment employs a unique waveform which allows for both current and voltage based cable identification within a relatively small and inexpensive device.

Transmitter 41 of FIG. 3 includes a microcontroller 45, a current regulator 47, an output driver 49 and two external leads—a first lead 51 and a second lead 53.

Receiver 43 (FIG. 3) is a two-part receiver; one part detects a voltage (electric field) and the other detects a current (magnetic field). The voltage sensing part comprises an external tip 55 and an amplifier 59. The current detecting part includes a current sensor 63, a filter/amplifier 65 and a demodulator 67. Receiver 43 further includes an adder 69 and a speaker 71, which are employed with either voltage or current detection.

In operation, within transmitter 41, microcontroller 45 outputs a unique waveform (illustrated in FIG. 4A). Output driver 49 receives the waveform from microcontroller 45 and boosts the current driving capability of the waveform. The magnitude of the waveform output by output driver 49 is determined by current regulator 47. Current regulator 47 varies the voltage of the waveform output by output driver 49 to ensure that the current which flows through first cable 19 is constant, regardless of the value of line terminator 39. When line terminator 39 is not present (i.e., open circuit condition), current regulator 47 outputs its maximum available voltage to output driver 49. The waveform output by output driver 49 is coupled to first cable 19, through first lead 51 and second lead 53. First lead 51 couples a positive voltage to center conductor 23 of first cable 19. Second lead 53 couples a lower voltage to outer conductor 25 of first cable 19. If line terminator 39 is present on first cable 19, a closed loop is formed and the applied waveform will induce current to flow from first lead 51, along center conductor 23, through line terminator 39, along outer conductor 25 and back to second lead 53. This applied current creates a magnetic field which can be detected anywhere along the length of first cable 19. If line terminator 39 is not present on first cable 19, a closed loop is not formed (current will not flow) and the applied waveform can be detected between center conductor 23 and outer conductor 25, at the end of first cable 19. In this way, the waveform output by output driver 49 is transmitted along first cable 19 as a current or a voltage, depending upon the presence or absence of line terminator 39.

Receiver 43 contains voltage detection circuitry (voltage sensor 55 and amplifier 59) and current detection circuitry (current sensor 63, filter/amplifier 65 and demodulator 67). Thus, receiver 43 is able to detect the applied waveform in either voltage or current mode. In voltage mode (i.e., in the absence of line terminator 39), the applied waveform transmitted along first cable 19 is detectable at the end of first cable 19 opposite the connection to transmitter 41, where both center conductor 23 and outer conductor 25 are accessible. When receiver 43 is held in close proximity to first cable 19, the voltage detection circuitry of receiver 43 detects voltages at the end of first cable 19. Voltage detecting receivers are common in the art and their design is well known to workers of ordinary skill. In voltage mode, external tip 55 is held in close proximity to the end of first cable 19, between center conductor 23 and outer conductor 25. External tip 55 detects a signal (electric field) present on first cable 19 (as discussed with reference to FIG. 4C). This signal, detected by external tip 55, is then amplified by amplifier 59 and passed through adder 69 to drive speaker 71.

In current mode (i.e., with the line terminator 39 connecting center conductor 23 and outer conductor 25 of first cable 19), the applied waveform is detectable at any point along first cable 19. In current mode, when receiver 43 is held in close proximity to first cable 19, current sensor 63 detects the magnetic field emanating from first cable 19 as a result of current flowing through the loop created by center conductor 23, line terminator 39 and outer conductor 25. This magnetic field induces a signal in current sensor 63. The signal from current sensor 63 is coupled to filter/amplifier 65, which filters unwanted signals and noise from the current signal and then amplifies the filtered signal. Filter/amplifier 65 is tuned to the frequency at which transmitter 41 is applying the waveform to first cable 19. In the preferred embodiment, this frequency is 84 kHz. Also, in the preferred embodiment, current sensor 63 consists of an air core coiled wire. However, other current sensors such as a magnetic core coil or a Hall Effect device can be used for this purpose.

The amplified and filtered signal from filter/amplifier 65 is coupled to demodulator 67, which produces a voltage signal proportional to the strength of the filtered/amplified signal output by filter/amplifier 65. The voltage signal output by demodulator 67 passes through adder 69 to speaker 71. Adder 69 adds the signal output from amplifier 59 and the signal output from demodulator 67. Because only one signal (voltage or current) is being detected at a given time, adder 69 simply passes the signal to speaker 71.

To clarify system operation, the operation of transmitting a unique waveform from transmitter 41 and receiving the same unique waveform at receiver 43 will be described by reference to FIGS. 4A–4C. As shown in FIGS. 4A–4C, the present invention outputs a unique waveform, which is detectable by receiver 43 (in either current or voltage form) and output as a distinct audio tone. If the unique waveform of FIG. 4A is applied to first cable 19 when line terminator 39 is connected between center conductor 23 and outer conductor 25, there will be a closed loop around which current can flow. Thus, current sensor 63 of receiver 43 will detect a distinct pattern (as represented by FIG. 4B) and a distinct audio tone will be output by speaker 71. If the unique waveform is applied to first cable 19, when first cable 19 has not been supplied with line terminator 39 (i.e., when there is no closed loop through which current can flow), the unique waveform will be detected by voltage sensor 57 of receiver 43 (as represented by the timing diagram of FIG. 4C), and receiver 43 will output a distinct audio tone, which differs from the distinct tone output during current mode.

Specifically, transmitter 41 outputs a unique pattern of 0.5 millisecond periods of 84 kHz square wave bursts, separated by alternating 0.5 millisecond constant voltage signals. Transmitter 41 outputs these 84 kHz square wave bursts for 0.5 millisecond every 1.0 millisecond (approximately 42 pulses per 0.5 millisecond). Between each 0.5 millisecond 84 kHz bursts, transmitter 41 emits an alternating pattern of high and low constant voltage signals, as represented in FIG. 4A. The alternating high and low voltage signals, which occur between the 84 kHz square wave bursts, therefore repeat every 2.0 milliseconds, with a frequency of 500 Hz, while the 84 kHz square wave bursts repeat every 1.0 millisecond with a frequency of 1 kHz.

FIG. 4A shows the timing diagram for the unique waveform output by transmitter 41. At a time $T_1$, transmitter 41 begins outputting an 84 kHz square wave. Transmitter 41 continues outputting this 84 kHz square wave for 0.5 milliseconds, until a time $T_2$. At time $T_2$, transmitter 41 outputs a high voltage (a voltage greater than zero) for 0.5 milliseconds until a time $T_3$. At time $T_3$, transmitter 41 again outputs an 84 kHz square wave for 0.5 milliseconds, until a time $T_4$. At time $T_4$, transmitter 41 outputs a low voltage (a voltage less than or equal to zero) for 0.5 milliseconds, until a time $T_5$. Thereafter (during a time $T_5$ through $T_9$, $T_9$ through $T_{13}$, etc.), transmitter 41 repeats the sequence of voltage signals output during time $T_1$ through time $T_5$ for approximately 0.25 seconds until a time $T_{500}$. At time $T_{500}$, transmitter 41 outputs a low voltage for approximately 0.25 seconds until a time $T_{1000}$. Thereafter, the voltage sequence output by transmitter 41 from time $T_1$ through time $T_{500}$, followed by the low voltage output by transmitter 41 during time $T_{500}$ through $T_{1000}$ is continuously repeated, with an overall period of 0.5 seconds (0.25 seconds of time $T_1$ through time $T_{500}$ signals and 0.25 seconds of time $T_{500}$ through $T_{1000}$ low voltage output).

FIG. 4B depicts current (magnetic field) detection within receiver 43. The presence of line terminator 39 is assumed. The current detection circuitry of receiver 43 responds to the 84 kHz square wave signal which is output by transmitter 41. Thus, for 0.5 milliseconds between time $T_1$ and time $T_2$, current sensor 63 detects a magnetic field, generated as a result of the 84 kHz signal output by transmitter 41. For the 0.5 milliseconds between time $T_2$ and time $T_3$ when transmitter 41 outputs a high voltage signal, no magnetic field will be detected by current sensor 63. For the 0.5 milliseconds between time $T_3$ and time $T_4$, current sensor 63 again detects a magnetic field, and for the 0.5 milliseconds between time $T_4$ and time $T_5$, when transmitter 41 outputs a low voltage signal, no magnetic field will be detected by current sensor 63. Thus, for approximately 0.25 seconds between time $T_1$ and time $T_{500}$, current sensor 63 detects the 84 kHz signal output by transmitter 41 every 0.5 milliseconds. For the approximately 0.25 seconds between time $T_{500}$ and time $T_{1000}$, when transmitter 41 outputs a low voltage, no magnetic field will be detected by voltage sensor 57.

Thus, FIG. 4B shows the current (magnetic field) detected by current sensor 63 and subsequently filtered, amplified, demodulated and emitted from speaker 71 as an audio tone. The current detection circuitry of receiver 43 (which contains a filter/amplifier tuned to 84 kHz) responds to the 84 kHz square wave bursts emitted by transmitter 41. Because these alternating square wave bursts repeat with a period of 1.0 milliseconds for 0.25 seconds, followed by 0.25 seconds with no 84 kHz square wave bursts, an operator tracing in current mode will hear a 1 kHz (f=1/1 milliseconds) tone pulsing on and off at a rate of 2 Hz (f=1/0.5 seconds).

FIG. 4C depicts voltage (electric field) detection within receiver 43. The absence of line terminator 39 is assumed. The voltage detection circuitry of receiver 43 responds to the high and low voltage signals which are output by transmitter 41, detecting the electric field generated thereby, but is not fast enough to respond to the 84 kHz square wave bursts. Thus, for 0.5 milliseconds between time $T_1$ and time $T_{21}$, when transmitter 41 outputs an 84 kHz signal, voltage sensor 57 is unable to respond to the 84 kHz signal. Voltage sensor 57 therefore, in effect, averages the electric field output during the 84 kHz square wave signal, measuring an electric field approximately half the value of the peak electric field present during the 84 kHz bursts between time $T_1$ and time T For 0.5 milliseconds between time $T_2$ and time $T_3$, voltage sensor 57 detects an electric field generated as a result of the high voltage signal output by transmitter 41. For 0.5 milliseconds between time $T_3$ and time $T_4$, when transmitter 41 outputs an 84 kHz signal, voltage sensor 57 again detects the average electric field of the 84 kHz square wave signal. For 0.5 milliseconds between time $T_4$ and time $T_5$, voltage sensor 57 detects an electric field generated as a result of the low voltage signal output by transmitter 41. In this example, the low voltage signal output by transmitter 41 is negative 5 volts, so that a negative electric field is detected. Thus, for approximately 0.25 seconds between time $T_1$ and time $T_{500}$, voltage sensor 57 detects the average electric field present as a result of the 84 kHz square wave signal and the electric field produced by the high/low voltage output by transmitter 41. For the approximately 0.25 seconds between time $T_{500}$ and time $T_{1000}$, when transmitter 41 outputs a low voltage, a negative electric field will be detected by voltage sensor 57.

Thus, FIG. 4C depicts the voltage (electric field) detected by voltage sensor 57 and subsequently amplified and emitted from speaker 71 as an audio tone. The voltage detection circuitry of receiver 43 responds to electric fields produced by the alternating high and low voltages between the 84 kHz square wave bursts emitted by transmitter 41. Because these alternating high and low voltages repeat with a period of 2.0 milliseconds for 0.25 seconds, followed by 0.25 seconds of a low voltage being output by transmitter 41, an operator tracing in voltage mode will hear a 500 Hz (f=1/2.0 milliseconds) tone pulsing on and off at a rate of 2 Hz (f=1/0.5 seconds).

To summarize, between 0.5 milliseconds 84 kHz square wave bursts, transmitter 41 repeatedly outputs a pattern of alternating high and low 0.5 milliseconds voltage signals for 0.25 seconds, followed by 0.25 seconds of low voltage output, creating a unique waveform with an overall period of 0.5 seconds, as shown in FIG. 4A. Because voltage sensor 57 and current sensor 63 detect different aspects of this waveform, the same waveform can be used in both the current and voltage mode. Further, the unique pattern of the waveform provides a first distinct audio tone pattern (FIG. 4B) to be emitted from speaker 71 in current mode, and a second distinct audio tone pattern (FIG. 4C) to be emitted from speaker 71 in voltage mode.

The foregoing description discloses only the preferred embodiment of the invention. Modifications of the above-disclosed apparatus and method which fall within the scope of the invention will be readily apparent to those skilled in the art. For example, the specific pattern of the unique waveform disclosed may be varied. While a square wave is the preferred waveform of the AC voltage signal applied to the cable, other waveforms such as sine, triangular, etc., may be employed. Further, while the preferred embodiments for magnetic field detection have been disclosed, other devices may be employed. Depending on the sensor employed, a magnetic sensor which senses the magnetic field from the cable may or may not need to make mechanical contact with the external surface of the cable under test. Likewise, a sensor for sensing the electric field may or may not need to make mechanical contact with the external surface of the cable under test, depending on the sensor employed. As well, the specific circuitry disclosed and the connections therebetween may be varied. Specific components may be substituted with equivalent components and the number of components may be increased or reduced and still remain within the scope of the present invention. Moreover, while the above disclosure focuses on tracing coaxial cables, the method and apparatus disclosed applies to the tracing of other cables such as triax cables and other multi-axial cables. Although the apparatus of the present invention has been described as producing an audio indication, alternative indicators may be used.

While the present invention has been disclosed in connection with the preferred embodiment thereof, it should be understood that there may be other embodiments which fall within the spirit and scope of the invention, as defined by the following claims:

What is claimed is:

1. An apparatus for non-destructively identifying and tracing a single coaxial cable in a bundle including a plurality of cables, said single coaxial cable having a center conductor and an outer conductor, the apparatus comprising:
   a transmitter having first and second output leads connectable, respectively, to said center conductor and said outer conductor of the coaxial cable, for applying a voltage to the coaxial cable at a first end of said cable;
   a line terminator manually connectable to and manually disconnectable from said center conductor and said outer conductor at a second end of the coaxial cable, for creating a loop between said first and second output leads of said transmitter, through said center conductor and said outer conductor of the coaxial cable, thereby allowing current to flow through said loop as a result of the applied voltage; and
   a receiver for non-destructively identifying the single coaxial cable within said bundle at said second end of said coaxial cable by detecting the applied voltage and for tracing the single coaxial cable anywhere along a span of said single coaxial cable between said first end and said second end by detecting the current which flows as a result of the applied voltage when the line terminator is installed at said second end of said coaxial cable.

2. The apparatus of claim 1 wherein said transmitter comprises a voltage generator.

3. The apparatus of claim 1 wherein said receiver comprises a sensor for detecting electric field and a sensor for detecting magnetic field.

4. The apparatus of claim 1 wherein said transmitter comprises a voltage generator and wherein said receiver comprises a sensor for detecting voltage and a sensor for detecting current.

5. The apparatus of claim 1 wherein said transmitter generates a current having a frequency within the range of 30 kHz to 100 kHz.

6. The apparatus of claim 1 wherein said transmitter generates a current having a frequency of 84 kHz.

7. An apparatus for non-destructively identifying and tracing a single multi-axial cable in a bundle including a plurality of cables, said single multi-axial cable having a plurality of center conductors and an outer conductor, comprising:
   a transmitter having first and second output leads connectable, respectively, to one of said center conductors and said outer conductor of said multi-axial cable, for applying a voltage to a first end of said multi-axial cable;
   a line terminator manually connectable to and manually disconnectable from said selected center conductor and said outer conductor at a second end of said multi-axial cable, for creating a loop between said first and second output leads of said transmitter, through said selected center conductor and said outer conductor of said multi-axial cable, thereby allowing current to flow from said transmitter through the cable and said line terminator; and a receiver for non-destructively identifying said single multi-axial cable within said bundle at said second end of said multi-axial cable by detecting the applied voltage and for tracing said single multi-axial cable anywhere along a span of said single multi-axial cable between said first end and said second end by detecting the current flowing as a result of the applied voltage when the line terminator is installed at said second end of said multi-axial cable.

8. The apparatus of claim 7 wherein said transmitter comprises a voltage generator.

9. The apparatus of claim 7 wherein said receiver comprises a sensor for detecting electric field and a sensor for detecting magnetic field.

10. The apparatus of claim 7 wherein said transmitter comprises a voltage generator and wherein said receiver comprises a sensor for detecting voltage and a sensor for detecting current.

11. The apparatus of claim 7 wherein said transmitter comprises a generator for generating a current having a frequency within the range of 30 kHz to 100 kHz.

12. The apparatus of claim 7 wherein said transmitter comprises a generator for generating a current having a frequency of 84 kHz.

13. A method for non-destructively identifying and tracing a single cable within a bundle of cables said bundle of cables having a first end and a second end, comprising:

identifying said single cable at said second end by applying a voltage to said single cable at said first end and detecting said voltage at said second end;

connecting a line terminator between a first conductor of said single cable and a second conductor of said single cable thereby creating a loop through which current can flow;

sending a current through said single cable from said first end; and detecting the current at a selected location anywhere along the cable's length.

14. The method of claim 13 wherein the sending step comprises applying a current with a frequency in the range of 30 kHz to 100 kHz.

15. The method of claim 14 wherein said line terminator comprises a resistor.

16. The method of claim 15 wherein the cable is multi-axial.

17. A receiver for detecting both the presence of a current signal and a voltage signal, and for use in locating a single cable within a bundle of cables and tracing said single cable having at least a first conductor and a second conductor, comprising:

a voltage sensor responsive to a first frequency range for detecting an electric field at an end of said cable; and a current sensor responsive to a second frequency range for detecting a magnetic field along the length of said cable;

such that a signal having components in both the first frequency range and the second frequency range may be detected by both said voltage sensor and said current sensor.

18. An apparatus for non-destructively locating and tracing a single cable within a bundle of cables, said single cable having at least one center conductor and an outer conductor, the apparatus comprising:

a transmitter having first and second output leads connectable, respectively, to a selected one of said at least one center conductor and said outer conductor of said single cable, for applying a voltage to the single cable;

a line terminator manually connectable to and manually disconnectable from said selected center conductor and said outer conductor of said single cable creating a loop between said first and second output leads of said transmitter, through the selected center conductor and the outer conductor of the single cable, thereby allowing current to flow as a result of the applied voltage; and a receiver for non-destructively identifying and tracing said single cable, said receiver detecting both the presence of a current signal and a voltage signal, and including:

a voltage sensor responsive to a first frequency range for detecting an electric field at an end of said cable; and a current sensor responsive to a second frequency range for detecting a magnetic field along the length of said cable, such that a signal having components in both the first frequency range and the second frequency range may be detected by both said voltage sensor and said current sensor.

* * * * *